United States Patent [19]
Sugibayashi

[11] Patent Number: 5,986,942
[45] Date of Patent: Nov. 16, 1999

[54] SEMICONDUCTOR MEMORY DEVICE

[75] Inventor: Tadahiko Sugibayashi, Tokyo, Japan

[73] Assignee: NEC Corporation, Tokyo, Japan

[21] Appl. No.: 09/233,701

[22] Filed: Jan. 19, 1999

[30] Foreign Application Priority Data

Jan. 20, 1998 [JP] Japan .................................. 10-008453

[51] Int. Cl.$^6$ .............................................. G11C 13/00
[52] U.S. Cl. ................ 365/189.01; 365/230.01
[58] Field of Search .................... 365/189.01, 230.01, 365/230.05, 233

[56] References Cited

U.S. PATENT DOCUMENTS 4,939,558  7/1990  Smayling .......................... 365/189.01

Primary Examiner—Terrell W. Fears
Attorney, Agent, or Firm—Darryl G. Walker

[57] ABSTRACT

A semiconductor memory device (100) having reduced logic gates for selecting sense amplifier columns (102-0 to 102-2) is disclosed. Sense amplifier columns (102-0 to 102-2) are selected according to block address values X5 to X0. The order in which sense amplifier columns (102-0 to 102-2) are selected corresponds to a gray code in the lower two significant block address values (X1 and X0). In this arrangement, X1 can be applied to a NAND gate 110-0 within sense amplifier selecting circuit 106-1 as predecoded signal C1. X0 can be applied to a NAND gate 110-1 within sense amplifier selecting circuit 106-2 as predecoded signal C2. The use of predecoded values (X0 and X1) instead of decoded values can reduce the logic required to select the sense amplifier columns (102-0 to 102-2).

20 Claims, 10 Drawing Sheets

| X5 | X4 | X3 | X2 | X1 | X0 | Signal |
|---|---|---|---|---|---|---|
| 1 | 1 | 1 | 1 | 1 | 1 | BSEL0 |
| 1 | 1 | 1 | 1 | 1 | 0 | BSEL1 |
| 1 | 1 | 1 | 1 | 0 | 0 | BSEL2 |
| 1 | 1 | 1 | 1 | 0 | 1 | BSEL3 |
| 1 | 1 | 1 | 0 | 1 | 1 | ⋮ |
| 1 | 1 | 1 | 0 | 1 | 0 | |
| 1 | 1 | 1 | 0 | 0 | 0 | |
| 1 | 1 | 1 | 0 | 0 | 1 | |
FIG. 4a
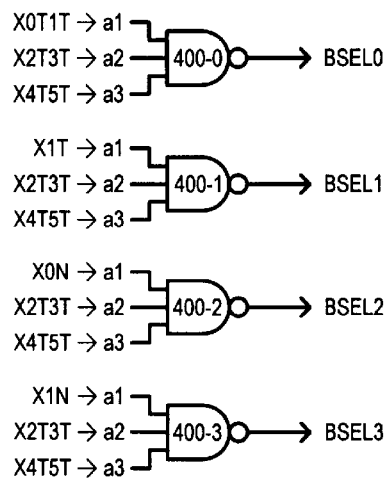
FIG. 4b
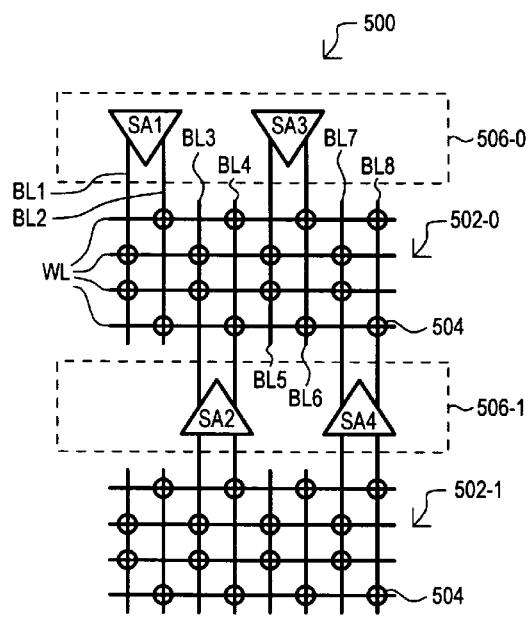
FIG. 5

| X5 | X4 | X3 | X2 | X1 | X0 | Signal |
|----|----|----|----|----|----|--------|
| 1 | 1 | 1 | 1 | 1 | 1 | BSEL0 |
| 1 | 1 | 1 | 1 | 1 | 0 | BSEL1 |
| 1 | 1 | 1 | 1 | 0 | 1 | BSEL2 |
| 1 | 1 | 1 | 1 | 0 | 0 | BSEL3 |
| 1 | 1 | 1 | 0 | 1 | 1 | ⋮ |
| 1 | 1 | 1 | 0 | 1 | 0 | ⋮ |
| 1 | 1 | 1 | 0 | 0 | 1 |  |
| 1 | 1 | 1 | 0 | 0 | 0 |  |
FIG. 7a
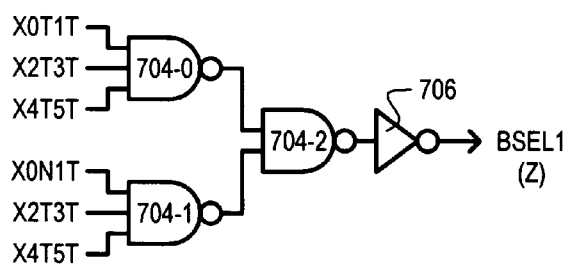
FIG. 7b
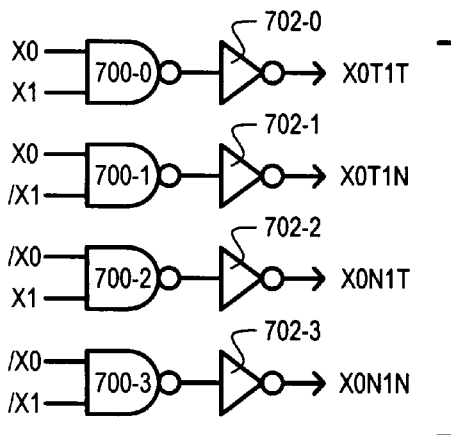
FIG. 7c

| | |
|---|---|
| BSEL0 → | SA COLUMN 0 |
| | MEMORY CELL ARRAY 0 |
| BSEL1 → | SA COLUMN 1 |
| | MEMORY CELL ARRAY 1 |
| BSEL2 → | SA COLUMN 2 |
| | MEMORY CELL ARRAY 2 |
| BSEL3 → | SA COLUMN 3 |
| | MEMORY CELL ARRAY 3 |
| BSEL4 → | SA COLUMN 4 |
| | MEMORY CELL ARRAY 4 |
| BSEL5 → | SA COLUMN 5 |
| | MEMORY CELL ARRAY 5 |
| BSEL6 → | SA COLUMN 6 |
| | MEMORY CELL ARRAY 6 |
| BSEL7 → | SA COLUMN 7 |
| | MEMORY CELL ARRAY 7 |
| BSEL8 → | SA COLUMN 8 |
| | MEMORY CELL ARRAY 8 |
| BSEL9 → | SA COLUMN 9 |
| | MEMORY CELL ARRAY 9 |
| BSEL10 → | SA COLUMN 10 |
| | MEMORY CELL ARRAY 10 |
| BSEL11 → | SA COLUMN 11 |
| | MEMORY CELL ARRAY 11 |
| BSEL12 → | SA COLUMN 12 |
| | MEMORY CELL ARRAY 12 |
| BSEL13 → | SA COLUMN 13 |
| | MEMORY CELL ARRAY 13 |
| BSEL14 → | SA COLUMN 14 |
| | MEMORY CELL ARRAY 14 |
| BSEL15 → | SA COLUMN 15 |
| | MEMORY CELL ARRAY 15 |
| BSEL16 → | SA COLUMN 16 |

FIG. 11

| X3 | X2 | X1 | X0 | MEMORY CELL ARRAY |
|---|---|---|---|---|
| 1 | 1 | 1 | 1 | 0 |
| 1 | 1 | 1 | 0 | 1 |
| 1 | 1 | 0 | 0 | 2 |
| 1 | 1 | 0 | 1 | 3 |
| 0 | 1 | 0 | 1 | 4 |
| 0 | 1 | 0 | 0 | 5 |
| 0 | 1 | 1 | 0 | 6 |
| 0 | 1 | 1 | 1 | 7 |
| 0 | 0 | 1 | 1 | 8 |
| 0 | 0 | 1 | 0 | 9 |
| 0 | 0 | 0 | 0 | 10 |
| 0 | 0 | 0 | 1 | 11 |
| 1 | 0 | 0 | 1 | 12 |
| 1 | 0 | 0 | 0 | 13 |
| 1 | 0 | 1 | 0 | 14 |
| 1 | 0 | 1 | 1 | 15 | ical fied 5,986,942

SEMICONDUCTOR MEMORY DEVICE

TECHNICAL FIELD

The present invention relates generally to semiconductor memory devices, and more particularly to semiconductor memory devices that select sense amplifiers connected to the bit lines of a memory cell array.

BACKGROUND OF THE INVENTION

The various embodiments of the present invention may be best understood by first describing a structure for a semiconductor memory device. FIG. 5 is a schematic diagram of a semiconductor memory device that includes sense amplifiers that are connected to the bit lines of a memory cell array. The semiconductor memory device is designated by the general reference character 500, and is shown to include a number of memory cells arranged into arrays, two of which are shown as items 502-0 and 502-1. Two memory cells are particularly shown by the reference character 504.

The memory cells 504 can include gates aligned in a row direction (horizontal in the particular view of FIG. 5). Word lines can be commonly connected to the gates within the same row. The word lines for array 502-0 are shown in FIG. 5 as "WL." In this arrangement, cells in a row are selected according to their associated word line. The memory cells 504 can include sources and drains, in which case, such terminals can be aligned in the column direction, connected to a bit line. Bit lines are identified in FIG. 5 as BL1–BL8. Thus, one cell can be selected by a corresponding word line and bit line. For certain memory cell types, the memory cell can be previously charged (or discharged), and thus indicate stored logic values. In addition, the semiconductor memory device 500 may read data from and write data into a selected cell at the same time.

As set forth in FIG. 5, the bit lines (BL1–B8) are connected to sense amplifiers, shown as SA1–SA4. In particular, bit lines BL1 and BL2 are connected to sense amplifier SA1, bit lines BL3 and BL4 are connected to sense amplifier SA2. In addition, bit lines BL5 and BL6 are connected to sense amplifier SA3, and bit lines BL7 and BL8 are connected to sense amplifier SA4.

The sense amplifier arrangement of FIG. 5 can be conceptualized as being disposed in a "zig-zag" manner. That is, the memory cells of the array 502-0 are alternately connected to sense amplifiers SA1 and SA3, which form a sense amplifier column 506-0, and sense amplifiers SA2 and SA4, which form another sense amplifier column 506-1.

A higher-level block diagram of a semiconductor memory device is set forth in FIG. 8. The semiconductor memory device of FIG. 8 is designated by the general reference character 800, and which is shown to include sense amplifier columns 802-0 to 802-2 alternately disposed between memory cell arrays 804-0 to 804-2. Sense amplifier columns (802-0 to 802-2) are shown to be connected to corresponding sense amplifier selecting circuits, shown as 808-0 to 808-2. The sense amplifier columns (802-0 to 802-2) are also shown to be connected to the bit lines BL of the memory cell arrays (804-1 to 804-2).

Sense amplifier selecting circuits (808-0 to 808-2) select sense amplifiers within the sense amplifier columns (802-0 to 802-2).

In addition to being connected to the sense amplifier columns (802-0 to 802-2) by bit lines, the memory cell arrays (804-0 to 804-2) are also shown to be connected to decoders 806-0 to 806-2 by word lines (shown as "WL").

The decoders (806-0 to 806-2) select cells in the row direction by selecting word lines.

The general arrangement of the sense amplifier selecting circuits (808-0 to 808-2) is illustrated in FIG. 8 by sense amplifier selecting circuits 808-1 and 808-2. Sense amplifier selecting circuit 804-1 is shown to include two NAND gates (808-00 and 808-01), a NOR gate 810-0, two inverters (812-00 and 812-01), a p-type transistor 814-0, and an n-type transistor 816-0. In the same general fashion, sense amplifier selecting circuit 808-2 is shown to include two NAND gates (808-10 and 808-11), a NOR gate 810-1, two inverters (812-10 and 812-11), a p-type transistor 814-1, and an n-type transistor 816-1.

The general operation of sense amplifier selecting circuit 808-1 will now be described. The sense amplifier selecting circuit 808-1 receives a block select signal A1 as an input The block select signal Ga1 is applied to NAND gate 808-00, which provides a select signal BSEL1 as an output. Accordingly, when the A1 signal is active (all inputs to NAND gate 808-00 are high) the BSEL1 signal is driven low. The BSEL1 signal is shown to be applied to sense amplifier column 802-1 and NAND gate 808-01. According to the BSEL1 signal tig, and other select signals (not shown) a word line is selected by decoder 806-0. The selected word line results in the selection of a memory cell row within memory cell array 804-0.

Continuing with the description of sense amplifier selecting circuit 808-1, in response to a low BSEL1 signal the NAND gate 808-01 output is driven high. The high value is inverted by inverter 812-00 and applied as an input to NOR gate 810-0. NOR gate 810-0 receives a sense signal SENS as another input. Thus, when the SENS signal and the output of inverter 810-0 are both low, the output of NOR gate 810-0 will be driven high. This value will be inverted by inverter 812-01 and applied to the gate of transistor 814-0. Transistor 814-0 will be turned on, resulting in drive signal SAP-0 being driven high. At the same time, the high output from NOR gate 810-0 is also applied to the gate of transistor 816-0, resulting in drive signal SAN-0 being driven low.

The high SAP-0 and low SAN-0 signals result in a sense amplifier within the sense amplifier column 802-1 being selected. For example, if reference is made to FIG. 5, sense amplifiers corresponding to SA2 or SA4 could be selected. Because a word line within memory cell array 804-0 has been previously selected, the selection of a sense amplifier results in the selection of a memory cell coupled to a bit line associated with the selected sense amplifier.

Sense amplifier selecting circuit 808-2 operates in a similar fashion to sense amplifier select circuit 804-1. Within sense amplifier select circuit 808-2, a block select signal A2 is applied to NAND gate 808-10. When the A2 signal is active, the output of NAND gate 808-10 (select signal BSEL2) will be low. The low BSEL2 signal will be applied to sense amplifier column 802-2. According to the BSEL2 signal timing, and other select signals (not shown), a word line is selected by decoder 806-1, resulting in the selection of a memory cell row within memory cell array 804-1. In response to a low BSEL2 signal, NAND gate 808-11 output is driven high, resulting in a low input to NOR gate 810-1. NOR gate 810-1 also receives a sense signal SENS as an input. Thus, in a similar fashion to the sense amplifier selecting circuit 808-1, a low SENS signal and active A2 signal will resulting in a drive signal SAP-1 that is high, and a drive signal SAN-1 that is low.

The high SAP-1 and low SAN-1 signals result in a sense amplifier within the sense amplifier column 802-2 being selected. For example, if reference is made to FIG. 5, the sense amplifier corresponding to SA2 or SA4 could be selected.

It is noted that the BSEL2 signal provided by NAND gate 808-10 is also applied to sense amplifier selecting circuit 808-1 and hence affects the operation of sense amplifier column 802-1. As a result, in addition to the selection of a sense amplifier within sense amplifier column 802-2 (such as sense amplifier SA2 or SA4 for an arrangement like FIG. 5), an active BSEL2 signal also selects a sense amplifier within sense amplifier column 802-1 (such as sense amplifier SA1 or SA3 for an arrangement like FIG. 5). Because a word line within memory cell array 804-1 has been previously selected, the selection of a sense amplifier within sense amplifier column 802-1 results in the selection of a memory cell. In this way, an active A2 signal and SENS signal will select sense amplifiers in both sense amplifier columns 802-1 and 802-2.

Referring now to FIG. 9, a sense amplifier column is illustrated in a schematic diagram. The sense amplifier column is designated by the general reference character 900, and is shown to include a sense amplifier 902 coupled to bit lines BL1 and BL2. The sense amplifier 902 includes two p-channel transistors 904-0 and 904-1, and two n-channel transistors 906-0 and 906-1. A node 908-0 between transistors 904-0 and 906-0 is coupled to bit line BL1, and forms one output for the sense amplifier 902. A node 908-1 between transistors 904-1 and 906-1 is coupled to bit line BL2, and forms another output for the sense amplifier 902. The SAP signal is applied to a drive node 910-0 common to transistors 904-0 and 904-1, and the SAN signal is applied to a drive node 910-1 common to transistors 906-0 and 906-1.

FIG. 9 also includes a select (and/or precharge) signal BSEL1a that is coupled to a first set of n-channel precharge transistors (912-0 to 912-2) and a second set of n-channel precharge transistors (912-3 to 912-5). When the BSEL1a signal is low, the precharge transistors 912-0 to 912-5 are disabled, allowing sense amplifier 902 to be selected.

The sense amplifier column 900 is also shown to receive separation signals TG0 and TG1. Separation signal TG1 is applied to n-channel transistors 914-0 and 914-1, which connect an upper portion (with respect to FIG. 9) of bit lines BL1 and BL2 to sense amplifier 902. Separation signal TG0 is applied to n-channel transistors 914-2 and 914-3, which connect a lower portion (with respect to FIG. 9) of bit lines BL1 and BL2 to sense amplifier 902. Separation signals TG0 and TG1 allow a selected memory cell to be separated from a non-selected memory cell. For example, if a word line results in a memory cell being coupled to the upper portion of bit lines BL1 and BL2, signal TG1 will be high to connect the memory cell to the sense amplifier 902. Signal TG0 will be low, to isolate non-selected memory cells coupled to the lower portion of bit lines BL1 and BL2.

Referring now to FIG. 10, a timing diagram is set forth illustrating the selection of a memory cell in a semiconductor memory device. FIG. 10 includes a number of signals, including a select/precharge signal BSEL, a word line signal WL, complementary drive signals SAP and SAN, a bit line pair response BL, and a cell node response CELL NODE. The cell node response illustrates a possible response of a data providing node on a selected memory cell.

At time t1, the BSEL signal transitions low, disabling precharge circuitry and allowing a sense amplifier to be selected. At time t2, a word line signal WL transitions high, representing the selection of a word line in a memory cell array. The selection of a word line results in a memory cell placing data on bit line pair BL. Thus, at time t2, the BL waveform begins to separate while the CELL NODE waveforms converge.

At time t3, with the input of an active sense signal SENS, the SAP signal goes high and the SAN signal goes low. As a result, the data signal on the bit line pair BL is further driven to high and low levels. The high and low BL levels charge the memory cell to a particular logic level, as illustrated by the waveforms of CELL NODE.

At time t4, the WL signal returns low, de-selecting the word line. Thereafter, at about time t5, the SAP and SAN signals return to an intermediate value and the BSEL signal returns high. This results in the bit lines BL being equalized (and/or precharged) to an intermediate level.

While the sense amplifier column arrangement of FIG. 9 provides for the selection of memory cells, the use of the TG1 and TG0 signals, which results in the separation of a selected memory cell from a non-selected memory cell, can introduce unwanted delay into the operation of a memory device. In particular, an arrangement such as that set forth in FIG. 9 may result in a delay in the propagation of a data signal from a memory cell array to the sense amplifier. For this reason, sense amplifier column arrangements that eliminate the use of TG1 and TG0 signals can be employed. An example of such a circuit is set forth in FIG. 3.

FIG. 3 illustrates a sense amplifier column 300 that does not utilize TG0 and TG1 signals. The sense amplifier column 300 includes a sense amplifier 302 having two p-channel transistors 304-0 and 304-1 and two n-channel transistors 306-0 and 306-1. In addition, precharge transistors 308-0 to 308-2 receive a select signal BSEL. In this arrangement, the BSEL signal must be operative (low in this particular example) for accesses to both an upper memory cell array (which would be coupled to the upper portion of bit lines BL1/BL2) and a lower memory cell array (which would be coupled to the lower portion of bit lines BL1/BL2). For this reason, the generation of the BSEL signal will differ from the generation of the precharge signals BSEL1 and BSEL2 of FIG. 8. In particular, one way to generate a BSEL for such a sense amplifier column, would be to utilize the output of inverters, shown as 812-00 and 812-10 in FIG. 8. The output that may be used as a BSEL signal is indicated by the letter "Z" in FIG. 8.

In addition, in the event sense amplifier columns, such as that set forth in FIG. 3, were to be used in the architecture of FIG. 8, the sense amplifier selecting circuits would operate in a different fashion. In particular, those NAND gates (808-00 and 808-10) within each sense amplifier selecting circuit (808-0 to 808-2) that receive block select signals (A1 and A2) would decode combinations of all block decode signals to generate an associated BSEL signal. The BSEL signals would then be generated from the output signals shown as Z, as described above. An example of such a block decoding arrangement is set forth in FIG. 7a.

FIG. 7a is a table illustrating a block decoding scheme. If it is assumed that the block addresses for the sense amplifier columns are given as X5 to X0, each different combination of X5 to X0 values will result in the activation of a different BSEL signal. For example, if values X5 to X0 are "111111" an active BSEL0 signal is output. When the X5 to X0 values are "111110," an active BSEL1 signal is output. In addition, X5 to X0 values of "111101" result in the output of an active BSEL2 signal, and when the X5 to X0 values are "111100," an active BSEL3 signal is output.

One way to generate the decoding operation set forth in FIG. 7a is set forth in schematic diagrams in FIGS. 7b and 7c. FIG. 7c illustrates how various values can be logically multiplied together to generate initial decoded values. FIG. 7c includes four circuits for accomplishing the logical multiplication, each circuit including a NAND gate (700-0 to 700-3) having an output coupled to an inverter (702-0 to 702-3). The various combinations of X0 and X1 values are logically multiplied together in FIG. 7c. In particular, the X0 and X1 values are multiplied together to generate a value X0T1T. The X0 and /X1 values (/X1 being the logical inverse of X1) are multiplied together to generate a value X0T1N. The /X0 and X1 values are multiplied to generate a value X0N1T, and the /X0 and /X1 values are multiplied together to generate a X0N1N value. In the same general fashion, the X2, /X2, X3, and /X3 values can be multiplied together, and the X4, /X4, X5 and /X5 values can be multiplied together.

The logically multiplied value pairs (which can be conceptualized as decoded values) can then be applied to additional logic to generate select signals, such as the signal Z of FIG. 8. The generation of such a signal is set forth in a circuit in FIG. 7b. FIG. 7b is a circuit that can be included within a sense amplifier selecting circuit, such as 808-1 in FIG. 8. The circuit of FIG. 7b generates a BSEL1 signal, and is shown to include three NAND gates (704-0 to 704-2) and an inverter 706. NAND gate 704-0 receives logically multiplied pairs X0T1T, X2T3T, and X4T5T as inputs, while NAND gate 704-1 receives logically multiplied pairs X0N1T, X2T3T and X4T5T. The outputs of NAND gates 704-0 and 704-1 are applied as inputs to NAND gate 704-2. The output of NAND gate 704-2 is inverted by inverter 706 to generate the BSEL1 signal. NAND gates 704-0 and 704-1 can be conceptualized as corresponding to NAND gate 808-00, NAND gate 704-2 can be conceptualized as corresponding to NAND gate 808-01, and inverter 706 can be conceptualized as corresponding to inverter 812-00.

The approach set forth in FIGS. 3 and 7 can improve the speed of a semiconductor memory device by eliminating the use of TG0 and TG1 signals, and thereby improve the speed at which a data signal from a memory array can propagate to a sense amplifier. However, such an approach is achieved at the cost of a complicated decoding scheme, such as that set forth in FIG. 7b. The speed advantages can thus be offset by the added circuitry required for decoding.

It would be desirable to provide some way of generating a select signal, such as the BSEL signals described above, that does not require as complex a logic arrangement such as that set forth in FIGS. 7b and 7c.

SUMMARY OF THE INVENTION

According to the disclosed embodiments, a semiconductor memory device includes a plurality of cell arrays, a plurality of decoders which select cells within the cell arrays in a row by way of a number of word lines. In addition, a plurality of sense amplifier columns are disposed between the cell arrays and connected to the cells within the cell arrays in a column direction by bit lines. The sense amplifiers are connected to their respective bit lines in a zigzag arrangement. A plurality of sense amplifier selecting circuits receive a number of address values and output select signals that select sense amplifiers within the sense amplifier columns. Sense amplifiers are selected in an order that corresponds to a gray code in the two lower address values.

Also according to the embodiments, the sense amplifier selecting circuits, the sense amplifier columns, and the cell arrays are disposed in the gray code order of the two lower significant address values.

Further according to the embodiments, the sense amplifier selecting circuits provide select signals in response to decoded upper address values. The decoded upper address values do not include the two lower significant address values.

Still further according to the embodiments, the semiconductor memory device is structured so that the two lower significant address values are arranged in an order that includes a first arrangement, a second arrangement, a third arrangement and a fourth arrangement One of the two lower significant address values is received by a sense amplifier selecting circuit that corresponds to the second arrangement, and the other of the two lower significant values is received by a sense amplifier selecting circuit that corresponds to the third arrangement Still further according to the embodiments described in the above paragraph, a decoded lower address value is received by the sense amplifier selecting circuit that corresponds to the first arrangement.

Still further according to the embodiments, the decoders select word lines in arrays based upon the logical multiplication of a select signal provided by an adjacent sense amplifier selecting circuit.

BRIEF DESCRIPTION OF THE DRAWINGS

FIGS. 4a and 4b set forth a table and schematic diagram illustrating the relationship between block address signals and select signals for selecting a sense amplifier column in the embodiments.

FIG. 5 is a schematic diagram illustrating the structure of a semiconductor memory device.

FIGS. 7a to 7c set forth a table and schematic diagrams illustrating the relationship between block address signals and select signals for selecting a sense amplifier column in a conventional arrangement.

FIG. 11 is a block diagram illustrating an arrangement of sense amplifiers and memory cell arrays according to another embodiment.

DETAILED DESCRIPTION OF THE EMBODIMENTS

Figure 1:
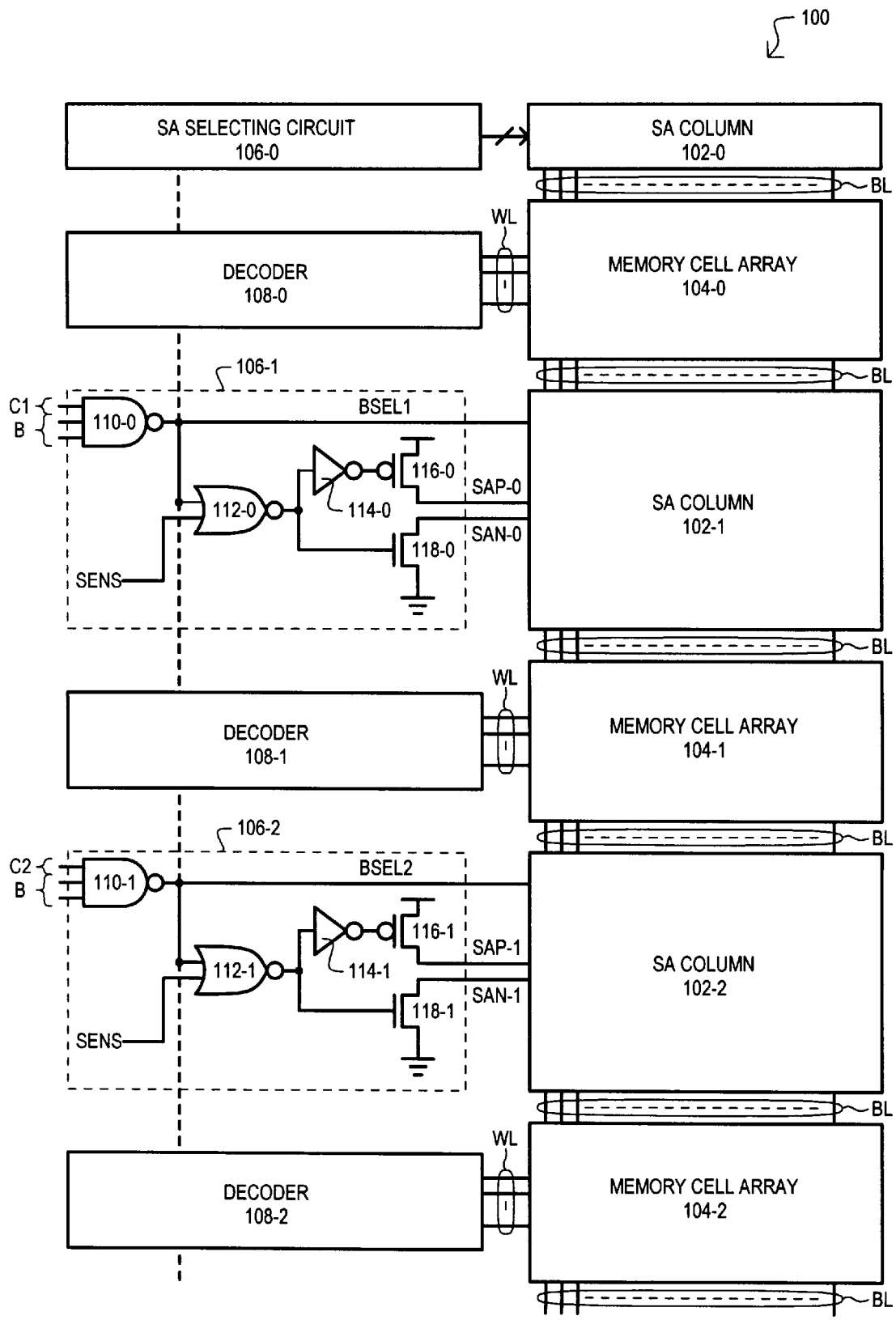
FIG. 1 is a block diagram of a semiconductor memory device according to one embodiment.
Figure 2:
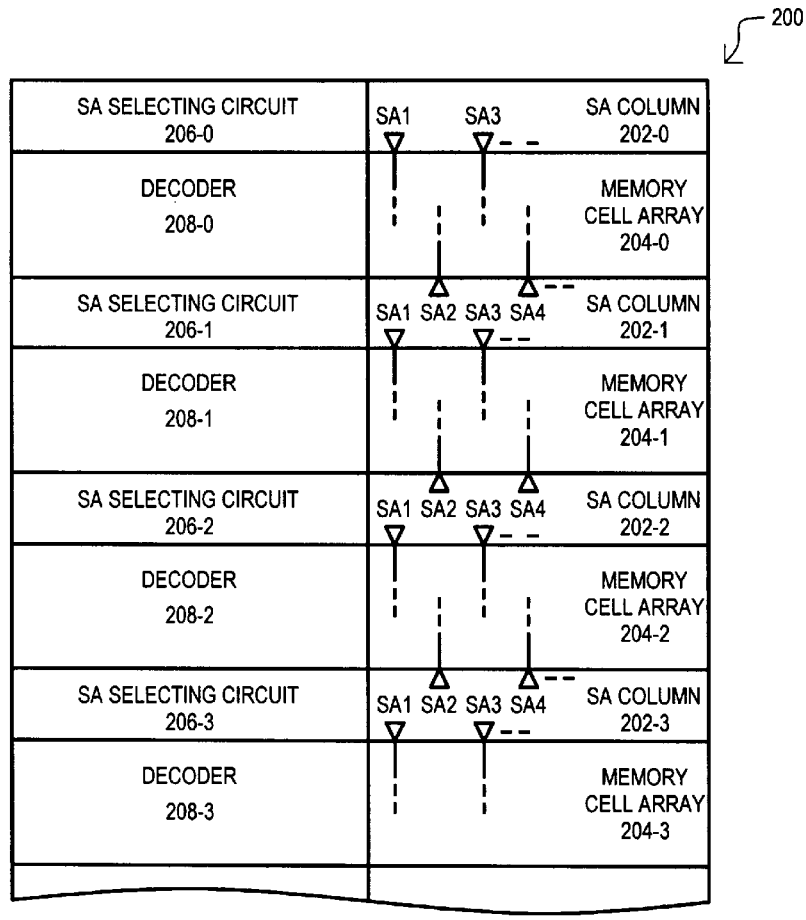
FIG. 2 is a diagram illustrating an arrangement of components of a semiconductor memory device according to one embodiment.

Various embodiments of the present invention will now be described with reference to a number of figures. FIG. 1 is a block diagram illustrating a semiconductor memory device according to a preferred embodiment. FIG. 2 is a block diagram setting forth one possible arrangement of components according to a preferred embodiment.

Referring now to FIG. 2, an arrangement of components for a semiconductor memory device is designated by the general reference character 200, and is shown to include sense amplifier columns (202-0 to 202-3) alternately disposed between memory cell arrays (204-0 to 204-3). Sense amplifiers within each sense amplifier column (202-0 to 202-3) are connected to rows of memory cells within adjacent memory cell arrays (204-0 to 204-3) by bit lines. In the particular arrangement of FIG. 2, the sense amplifiers are connected to the bit lines in a zig-zag (202-0 to 202-3) pattern. To illustrate this, selected sense amplifiers are shown in FIG. 2 as SA1, SA2, SA3 and SA4.

The sense amplifier columns (202-0 to 202-3) are shown to be connected to an associated sense amplifier selecting circuits (206-0 to 206-3). Each sense amplifier selecting circuit (206-0 to 206-3) selects a sense amplifier within its associated sense amplifier column (202-0 to 202-3).

The memory cell arrays (204-0 to 204-3) are each connected to an associated decoder (208-0 to 208-3). Each decoder (208-0 to 208-3) can select a memory cell within its associated memory cell array (204-0 to 204-3) in a row-wise direction by selecting a word line.

Referring now to FIG. 1, a semiconductor memory device 100 is set forth in a block schematic diagram that includes many of the same general constituents as FIG. 2. Included in FIG. 1 are sense amplifier columns (102-0 to 102-2), memory cell arrays (104-0 to 104-2), sense amplifier selecting circuits (106-0 to 106-2), and decoders (108-0 to 108-2). The sense amplifier selecting circuits (106-0 to 106-2) are each shown to include a NAND gate (110-0 and 110-1), a NOR gate (112-0 and 112-1), an inverter (114-0 and 114-1), a p-channel transistor (116-0 and 116-1), and an n-channel transistor (118-0 and 118-1).

The operation of sense amplifier selecting circuit 106-1 will now be described. In response to the application of block select signals B and a predecoded signal C1, the output of NAND gate 110-0 drives a select signal BSEL1 low. According to the BSEL1 signal timing, and other select signals (not shown) a word line is selected by decoder 108-1, resulting in the selection of a memory cell row within memory cell array 104-1. The selected memory cells can be connected to bit lines that are associated with particular sense amplifiers within sense amplifier column 102-1. For example, if reference is made to FIG. 2, the sense amplifiers can correspond to sense amplifiers SA1 and SA3. Alternatively, a word line can be selected by decoder 108-0, resulting in the selection of a memory cell row within memory cell array 104-0. The selected memory cells can be connected to bit lines that are associated with particular sense amplifiers within sense amplifier column 102-1. For example, if reference is made to FIG. 2, the sense amplifiers can correspond to sense amplifiers SA2 and SA4.

The BSEL1 signal is also applied to NOR gate 112-0 along with a sense signal SENS. Provided the BSEL1 signal is low, when the SENS signal is low the output of NOR gate 112-0 will be driven high This value will be inverted by inverter 114-0 and applied to the gate of transistor 116-0. Transistor 116-0 will be turned on, resulting in drive signal SAP-0 signal being driven high. At the same general time, the high output from NOR gate 112-0 is also applied to the gate of transistor 118-0, resulting in drive signal SAN-0 signal being driven low.

The high SAP-0 and low SAN-0 signals result in a sense amplifier within the sense amplifier column 102-1 being selected. For example, in a sense amplifier arrangement such as that set forth FIG. 2, the SAP-0 and SAN-0 signals can result in a sense amplifier from SA1 to SA4 being selected.

The operation of sense amplifier selecting circuit 106-2 will now be described. In response to the application of block select signals B and a predecoded signal C2, the output of NAND gate 110-1 drives a select signal BSEL2 low. According to the BSEL2 signal timing, and other select signals (not shown) a word line can be selected by decoder 108-1, resulting in the selection of a memory cell row within memory cell array 104-1. The selected memory cells can be connected to bit lines that are associated with particular sense amplifiers within sense amplifier column 102-2. For example, if reference is made to FIG. 2, the sense amplifiers can correspond to sense amplifiers SA2 and SA4. Alternatively, a word line can be selected by decoder 108-2, resulting in the selection of a memory cell row within memory cell array 104-2. The selected memory cells can be connected to bit lines that are associated with particular sense amplifiers within sense amplifier column 102-2. For example, if reference is made to FIG. 2, the sense amplifiers can correspond to sense amplifiers SA1 and SA3.

The BSEL2 signal is also applied to NOR gate 112-1 along with a sense signal SENS. Provided the BSEL2 signal is low, when the SENS signal is low the output of NOR gate 112-1 will be driven high. This value will be inverted by inverter 114-1 and applied to the gate of transistor 116-1. Transistor 116-1 will be turned on, resulting in drive signal SAP-1 signal being driven high. At the same general time, the high output from NOR gate 112-1 is also applied to the gate of transistor 118-1, resulting in drive signal SAN-1 signal being driven low.

The high SAP-1 and low SAN-1 signals result in a sense amplifier within the sense amplifier column 102-2 being selected. For example, in a sense amplifier arrangement such as that set forth FIG. 2, the SAP-1 and SAN-1 signals can result in a sense amplifier from SA1 to SA4 being selected.

In this manner, memory cells within memory cell arrays 104-0 and 104-1 are selected according to the select signal BSEL1 output from sense amplifier selecting circuit 106-1. In addition, memory cells within memory cell arrays 104-1 and 104-2 are selected according to the select signal BSEL2 output from sense amplifier selecting circuit 106-2.

From the above described operations it is understood that a BSEL0 signal could be output from sense amplifier selecting circuit 106-0. As a result, according to the BSEL0 signal timing, and other select signals (not shown) a word line is selected by decoder 108-0, resulting in the selection of a memory cell row within memory cell array 104-0. The selected memory cells can be connected to bit lines that are associated with particular sense amplifiers within sense amplifier column 102-0. For example, if reference is made to FIG. 2, the sense amplifiers can correspond to sense amplifiers SA1 and SA3.

It is also understood that a BSEL3 signal could be output from sense amplifier selecting circuit 106-3 (not shown in FIG. 1, and disposed below decoder 108-2). As a result, according to the BSEL3 signal timing, and other select signals (not shown) a word line is selected by decoder 108-2, resulting in the selection of a memory cell row within memory cell array 104-2. The selected memory cells can be connected to bit lines that are associated with particular sense amplifiers within a sense amplifier column 102-3 (not shown in FIG. 1, and situated below cell array 104-2). For example, if reference is made to FIG. 2, the sense amplifiers can correspond to sense amplifiers SA2 and SA4. Alternatively, a word line can be selected by a decoder 108-3 (not shown in FIG. 1, and situated below sense amplifier selecting circuit 106-3), resulting in the selection of a memory cell row within the memory cell array 104-3. The selected memory cells can be connected to bit lines that are associated with particular sense amplifiers within sense amplifier column 102-3. For example, if reference is made to FIG. 2, the sense amplifiers can correspond to sense amplifiers SA1 and SA3.

Figure 3:
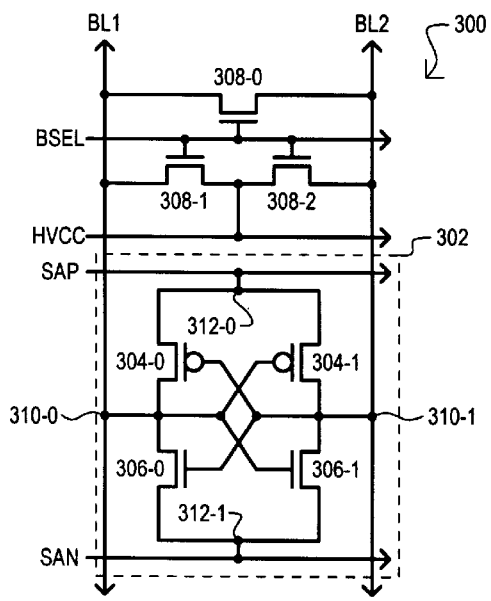
FIG. 3 is schematic diagram illustrating a sense amplifier arrangement that may be used in the embodiments.
Figure 9:
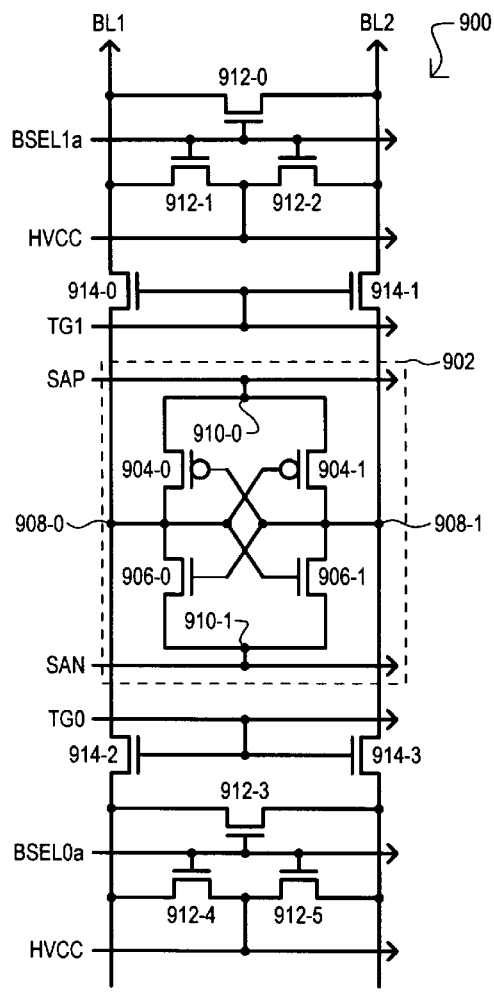
FIG. 9 is a schematic diagram illustrating a conventional sense amplifier arrangement.

Referring once again to FIG. 3, a schematic diagram is set forth illustrating an arrangement that may be used in sense amplifier columns 202-0 to 202-3 of FIG. 2, and 102-0 to 102-2 of FIG. 1. It is recalled that the sense amplifier column 300 illustrated by FIG. 3 differs from the sense amplifier column 900 of FIG. 9 in that it does not utilize TG0 or TG1 signals. The sense amplifier column 300 includes a sense amplifier 302 having two p-channel transistors 304-0 and 304-1 and two n-channel transistors 306-0 and 306-1. A common node between transistors 304-0 and 306-0 forms a first output node 310-0, and a common node between transistors 304-1 and 306-1 forms a second output node 310-1. In addition, the SAP signal is received at a first drive node 312-0 common to transistors 304-0 and 304-1. The SAN signal is received at a second drive node 312-1 common to transistors 306-0 and 306-1.

Referring back to FIG. 1, the generation of the select signals (BSEL1 and BSEL2) according to the block select signal B and predecoded signals C1 and C2 will be described in more detail. The block select signal B is generated by decoding a block address. The predecoded signals C1 and C2 are obtained prior to any block address decoding. The resulting overall decoding arrangement is set forth in FIG. 4a.

As shown in FIG. 4a the decoding scheme illustrated receives a number of block address values (X5 to X0) and provides various block select signals, including the signals BSEL0 to BSEL3. In particular, when the block address values X5 to X0 are "111111," the BSEL0 signal is activated. When the block address values X5 to X0 are "111110," the BSEL1 signal is activated. When the block address values X5 to X0 are "1111100," the BSEL2 signal is activated. When the block address values X5 to X0 are "111110," the BSEL3 signal is activated.

The two lower bits (X1 and X0) in the decoding arrangement of FIG. 4a illustrate a "gray code." That is, the two lower address bits change by only one bit for each subsequent select value (BSEL0, BSEL1, BSEL2 . . . ). The gray code decoding arrangement is accomplished in FIG. 1 by the use of the predecoded signals C1 and C2.

In this arrangement, sense amplifier columns that are selected on the basis of block address values (such as X5 to X0) are selected by using block address values that have not yet been decoded (the predecoded signals C1 and C2). The non-decoded block address values are applied to input NAND gates (such as 110-0 and 110-1), thus eliminating the need for a logic gate at stage before the NAND gate (such as the gates 704-0 and 704-1 in FIG. 7). This provides for a more simplified decoding structure. In addition, the resulting decoding structure reduces delays in the generation of select signals (such as BSEL0 to BSEL3), providing for higher speed accesses to memory cells.

Referring now to FIG. 4b, a particular decoding circuit is set forth illustrating the generation of the BSEL0, BSEL1 and BSEL2 signals, according to one embodiment FIG. 4b includes four NAND gates 400-0, 400-1, 400-2 and 400-3 which can be conceptualized as corresponding to NAND gates within each sense amplifier selecting circuit 106-0, 106-1, 106-2 and 106-3 (not shown), respectively. In particular, NAND gates 400-1 and 400-2 can be considered to correspond to NAND gates 110-0 and 110-1. In FIG. 4b each NAND gate (400-0 to 400-2) is shown to include three inputs, a1, a2 and a3. NAND gates 400-0 provides the BSEL0 signal as an output, NAND gate 400-1 provides the BSEL1 signal as an output, NAND gate 400-2 provides the BSEL2 signal as an output, and NAND gate 400-3 provides the BSEL3 signal as an output.

In the particular arrangement of FIG. 4b, gates 400-0 to 400-3 each receive the logical multiplication of the X2 and X3 values at input a2, and the logical multiplication of the X4 and X5 values at an input a3. Gate 400-0 is shown to receive the logical multiplication of the X0 and X1 values at input a1.

On the other hand, the a1 input to gate 400-1 is the non-decoded value X1 (shown as X1T), taken from the two non-decoded values of X0and X1. In addition, the a1 input to gate 400-2 is the non-decoded value of "inverse" X0 (shown as X0N). Furthermore, the a1 input to gate 400-3 is the non-decoded value of inverse X1 (shown as X1N).

In this way, a semiconductor memory device can include a number of blocks. Each block can include sense amplifier selecting circuits (such as 106-0 to 106-2 in FIG. 1 or 206-0 to 206-3 in FIG. 2), sense amplifier columns (such as 102-0 to 102-2 in FIG. 1 or 202-0 to 202-3 in FIG. 2), decoders (such as 108-0 to 108-2 in FIG. 1 or 208-0 to 208-3 in FIG. 2), and cell arrays (such as 104-0 to 104-2 in FIG. 1 or 204-0 to 204-3 in FIG. 2) disposed in the block in a gray code order. The block can then be selected by block address values X5 to X2. The sense amplifier selecting circuits (106-0 to 106-2 and 206-0 to 206-3) can then be selected according to the gray code order with non-decoded values. In particular, for a block illustrated by FIG. 1, the sense amplifier selecting circuits 106-1 to 106-3, that follow sense amplifier selecting circuit 106-0, can be selected by the direct application of non-decoded X1 and X0 values as predecoded signals C1 and C2. For a block illustrated by FIG. 2, the sense amplifier selecting circuit 206-1 to 206-3, that follow sense amplifier selecting circuit 206-0, can be selected by the direct application of non-decoded X1 and X0 values.

It is understood from the logic set forth in FIG. 4b that combinations of X1 and X0 values can result in the activation of a pair of select signals. For example, for X1=1 and X0=1, the BSEL0 and BSEL1 signals will be active. For X1=1 and X0=0, the BSEL1 and BSEL2 signals will be active. For X1=0 and X0=0, the BSEL2 and BSEL3 signals will be active.

Figure 10:
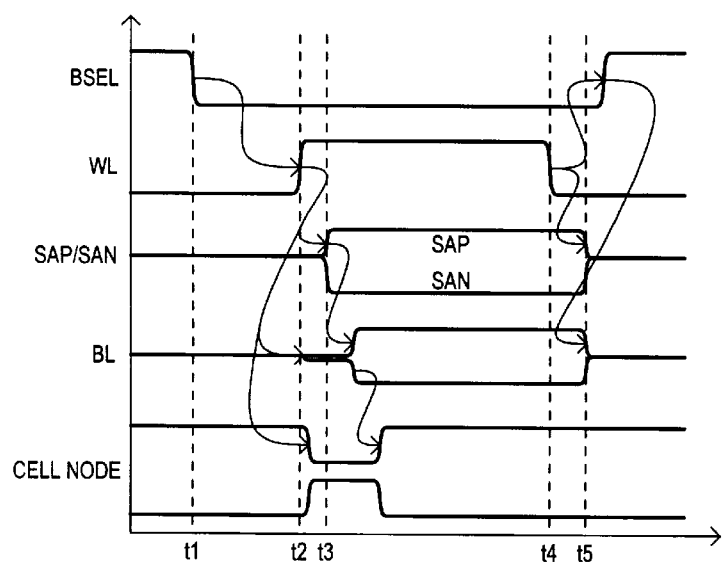
FIG. 10 is a timing diagram illustrating the operation of various components in a semiconductor memory device.

In the particular embodiments set forth above, sense amplifier columns are selected in a different fashion than conventional approaches. Consequently, the logic of the corresponding decoders may be more complex than that of a conventional approach. However, as shown by the timing arrangement of FIG. 10, the activation of word lines (WL) can occur after the activation of the select (precharge) signal BSEL. Therefore, the decoders of the described embodiments do not significantly impact the speed of memory cell accesses.

Figure 6A:
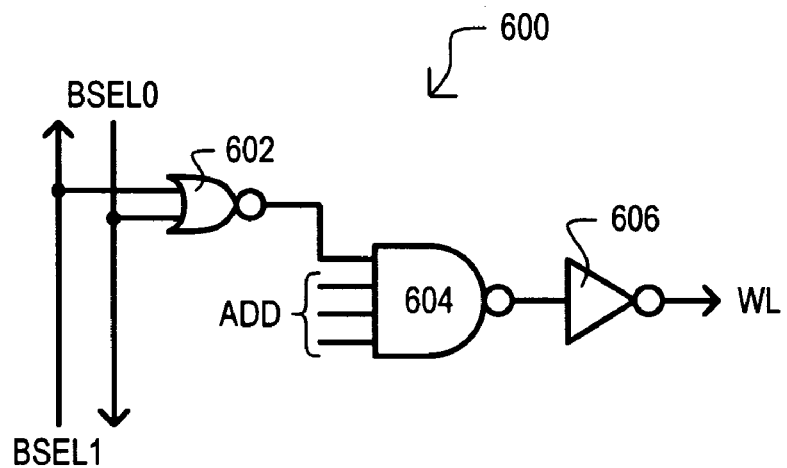
FIGS. 6a and 6b are schematic diagrams illustrating a decoder of one embodiment and a decoder of a conventional approach.
Figure 6B:
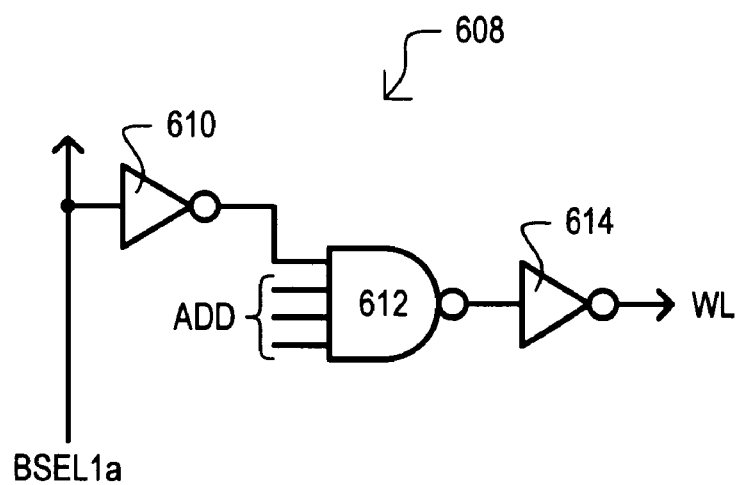

Referring now to FIGS. 6a and 6b, examples of decoders are set forth. FIG. 6a illustrates a decoder 600 that can be employed in the decoder 108-0 of FIG. 1 or the decoder 208-0 of FIG. 2. When utilized as decoder 108-0, decoder 600 receives the BSEL0 signal from a NAND gate (not shown) within sense amplifier selecting circuit 106-0 and the BSEL1 signal from NAND gate 110-0. The decoder 600 is shown to include a NOR gate 602 and NAND gate 604. NOR gate 602 receives the BSEL0 and BSEL1 signals as inputs. The output of NOR gate 602 is applied as one input to NAND gate 604. The remaining inputs to NAND gate 604 are address signals ADD. The output of NAND gate 604 is inverted by an inverter 606 to generate a word line signal WL. In this arrangement, when the sense amplifier banks on both sides of a memory cell array are active, a word line can be selected within the memory cell array.

Figure 8:
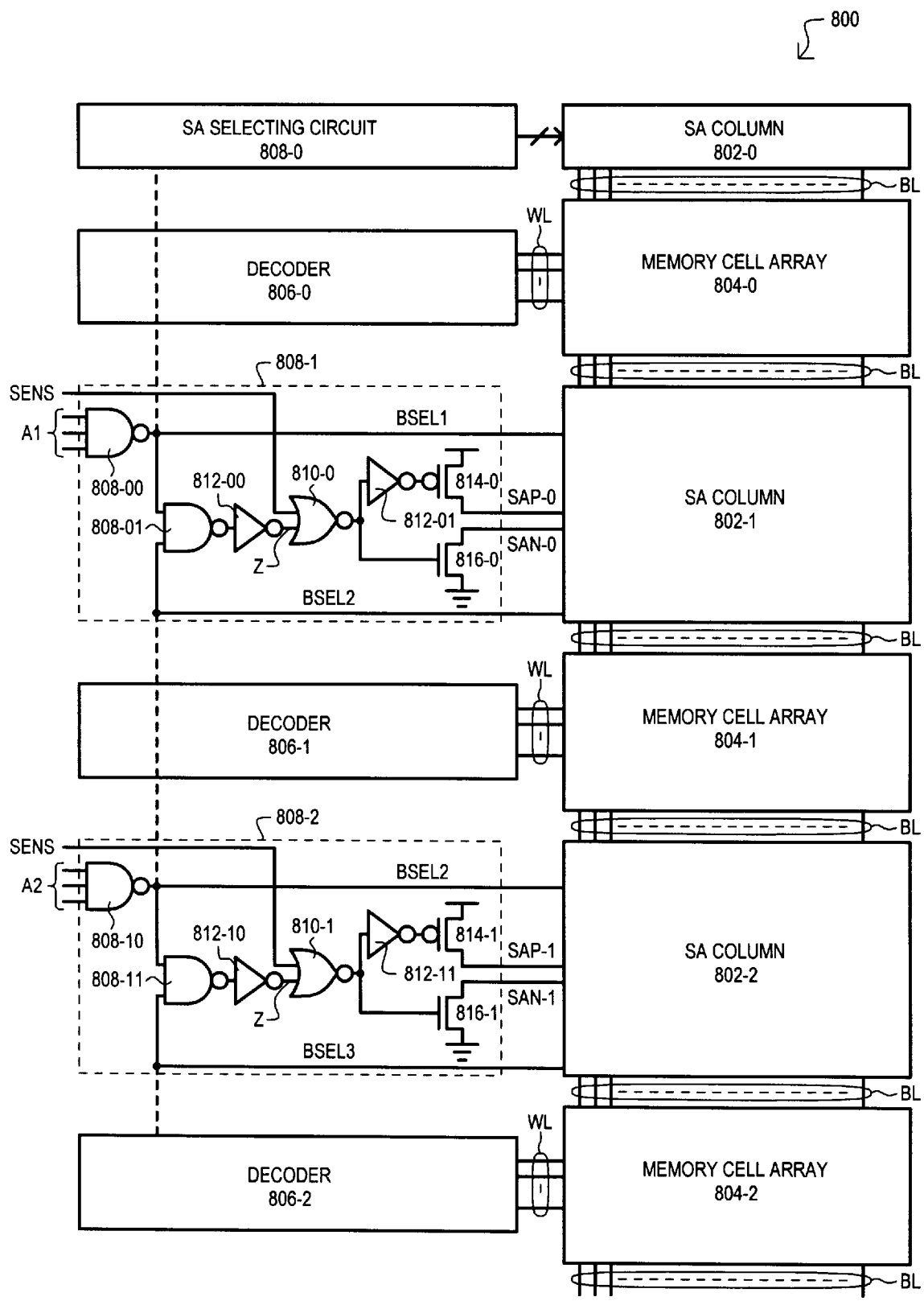
FIG. 8 is a block diagram of a conventional semiconductor memory device.

FIG. 6b is provided to indicate a conventional decoder 608 that may be used as the decoder 806-0 in FIG. 8. The conventional decoder 608 includes an inverter 610 that receives a select (precharge) signal BSEL1a from an adjacent sense amplifier selecting circuit The output of inverter 610 is applied as an input to a NAND gate 612. The output of NAND gate 612 is inverted by inverter 614 to generate a word line signal WL.

The disclosed embodiments thus describe a semiconductor memory device having a number of memory cell arrays and decoders that select memory cells within the memory cell arrays. Sense amplifier columns are disposed between the memory cell arrays and connected thereto by bit lines. The sense amplifier columns include sense amplifiers arranged in a zig-zag pattern. Sense amplifier selecting circuits select sense amplifiers within each sense amplifier column according to a number of address bits. In particular, sense amplifiers are selected by the least two significant address bits according to a gray code. The use of a gray code allows address values to be used to select sense amplifiers without being decoded first, eliminating a logic gate used in conventional approaches, and providing for a faster semiconductor memory device operation.

Furthermore, in the decoder arrangement set forth in FIG. 6a, a decoder selects a word line based in the logic multiplication of a select signal from a sense amplifier selecting circuit. This arrangement advantageously does not require a timing signal that may be required for conventional decoding approaches.

Another embodiment of the present invention will be described with reference to FIGS. 11–14.

Referring now to FIG. 11, the memory cell arrays 0–15 and the sense amplifier (SA) columns 0–16 are arranged alternately. The SA columns 0–16 are selected in response to an active state of the signals BSEL0–16, respectively. The signals BSEL0–16 are generated by the NAND gates shown in FIG. 14. Each of the NAND gates is incorporated into an associated sense amplifier selecting circuit as NAND gate 110-0 shown in FIG. 1. Each of the NAND gates receives two signals, for example, signal X0T1T and signal X2T3T. Such signals are generated by the circuit shown in FIG. 13.

Figures 12, 13:
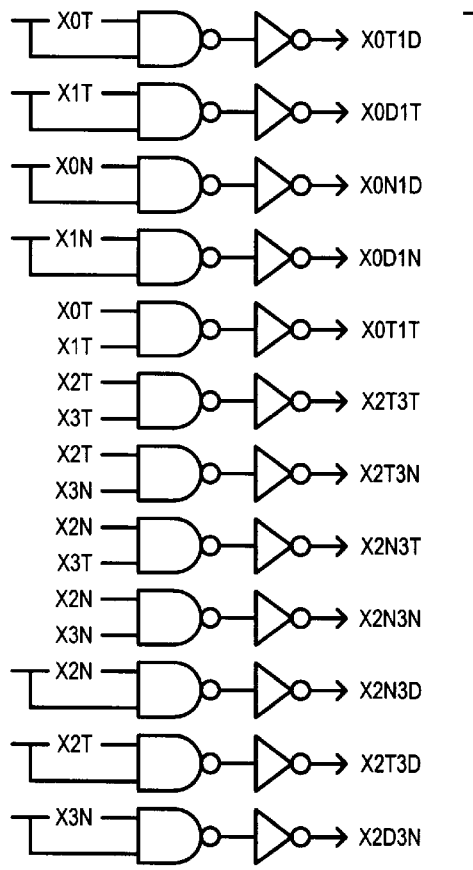
FIG. 12 is a table illustrating the relationship between block address signals and selected memory cell arrays according to another embodiment.
FIG. 13 is a schematic diagram illustrating a partial decoder according to another embodiment.
Figure 14:
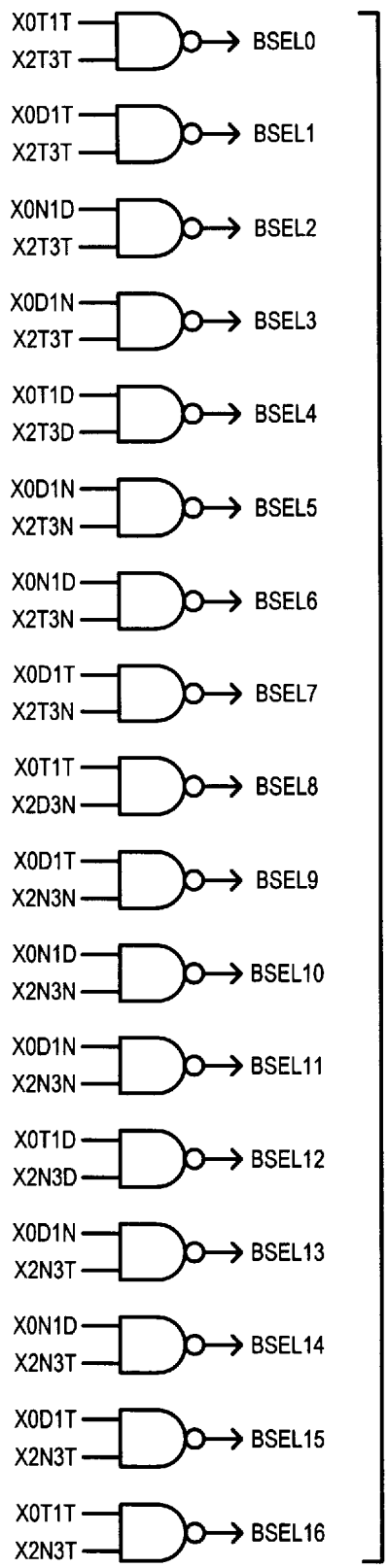
FIG. 14 is schematic diagram illustrating NAND gates incorporated into sense amplifier selecting circuits according to another embodiment.

FIG. 12 shows a relationship between block address signals and selected memory cell arrays. For example, the memory cell array 0 is selected when each block address signal X3–X0 is 1 (high level). In this case, both of the signals BSEL0 and BSEL1 are activated so that both of the SA column 0 and SA column 1 are selected.

Turning now to FIG. 13, it is apparent that all signals X0T1D–X2D3N are generated by the NAND gate and the inverter from the address signals X0T–X3N. This means that the transition signals X0T1D–X2D3N are simultaneous in response to the transition of the address signals X0T–X3N. Thus, the device according to this embodiment is suitable for high speed operation.

It is understood that while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor memory device, comprising:
    a plurality of cell arrays;
    a plurality of decoders that select cells within the cell arrays;
    a plurality of sense amplifier columns disposed between the cell arrays; and
    a plurality of sense amplifier selecting circuits, each sense amplifier selecting circuit receiving a plurality of address values and providing a select signal that selects at least one sense amplifier within an associated sense amplifier column, the sense amplifier selecting circuits providing select signal values in a gray code order according to at least two lower significant address values.

2. The semiconductor memory device of claim 1, wherein:
    the sense amplifier selecting circuits and sense amplifier columns are arranged within the semiconductor memory device in an order, the order corresponding to the gray code order.

3. The semiconductor memory device of claim 2, wherein:
    the memory cell arrays are arranged in the gray code order.

4. The semiconductor memory device of claim 1, wherein:
    selected decoders are disposed adjacent to corresponding pairs of sense amplifier selecting circuits, the selection of memory cells by the decoders including the selecting of at least one word line, the word lines being selected according to a logical multiplication with the select signals of the corresponding pair of sense amplifier selecting circuits.

5. The semiconductor memory device of claim 1, wherein:
    the address values include higher significant address values in addition to the lower significant address values; and
    selected sense amplifier selecting circuits receive at least one lower significant address values and decoded higher significant address values.

6. The semiconductor memory device of claim 5, wherein:
    the gray code can be generated by variations in two lower significant address values, the variations including a first arrangement, a second arrangement, a third arrangement, and a fourth arrangement; and
    at least one sense amplifier selecting circuit corresponds to each variation, the sense amplifier selecting circuit corresponding to the second variation receiving one of the two lower significant address values, the sense amplifier selecting circuit corresponding to the third variation receiving the other of the two lower significant address values.

7. The semiconductor memory device of claim 5, wherein:
    the gray code can be generated by variations in two lower significant address values, the variations including a first arrangement, a second arrangement, a third arrangement, and a fourth arrangement; and at least one sense amplifier selecting circuit corresponds to each variation, the sense amplifier selecting circuit corresponding to the first variation receiving decoded lower significant address values.

8. The semiconductor memory device of claim 1, wherein:

the decoders select cells within the cell arrays in a row direction by word lines;

sense amplifiers within each sense amplifier column are connected to cells within a cell array in a column direction by bit lines, sense amplifiers within each sense amplifier column having alternating positions that form a zig-zag sense amplifier arrangement.

9. The semiconductor memory device of claim 8, wherein:

the zig-zag sense amplifier arrangement includes sense amplifiers alternating every other position to form odd sense amplifiers on one side of the sense amplifier column and even sense amplifiers on another side of a sense amplifier column.

10. A semiconductor memory device, comprising:

a plurality of blocks, each block including a plurality of sense amplifier selecting circuits;

a block within the semiconductor memory device being selected according to decoded upper address values; and sense amplifier selecting circuits within a block being selected according to progressive variations in at least two lower address values, the progressive variations corresponding to a gray code.

11. The semiconductor memory device of claim 10, wherein:

each sense amplifier selecting circuit of the same block includes an input logic circuit for logically combining decoded upper address values.

12. The semiconductor memory device of claim 11, wherein:

the input logic gates of at least one of sense amplifier selecting circuits further logically combines a lower address value; and the input logic gates of at least another of the sense amplifier selecting circuits further logically combines decoded lower address values.

13. The semiconductor memory device of claim 10, further including:

each sense amplifier selecting circuit activating a select signal when selected; and a sense amplifier column corresponding to each sense amplifier selecting circuit, each sense amplifier column including a plurality of sense amplifiers.

14. The semiconductor memory device of claim 13, further including:

a plurality of memory cell arrays;

the sense amplifier columns include a sense amplifier column disposed on a first side of each memory cell array and a sense amplifier column disposed on a second side of each memory cell array, and the sense amplifiers within the sense amplifier columns include even sense amplifiers coupled to the first side of a memory cell array and odd sense amplifiers coupled to the second side of a memory cell array, at least one even and odd sense amplifier being selected in response to a corresponding active select signal.

15. The semiconductor memory device of claim 10, wherein:

each block includes at least four sense amplifier selecting circuits, a first sense amplifier selecting circuit is selected according to decoded upper and lower address values, a second sense amplifier selecting circuit is selected according to decoded upper address values and at least a first non-decoded lower address value, a third sense amplifier selecting circuit is selected according to decoded upper address values and at least a second non-decoded lower address value, and a fourth sense amplifier selecting circuit is selected according to decoded upper address values.

16. A semiconductor memory device, comprising:

an address signal decoder for logically combining upper address values to generate decoded upper address values, and logically combining lower address values to generate decoded lower address values;

a first sense amplifier selecting circuit having input logic that logically combines decoded upper address values and decoded lower address values to generate a first select signal;

a second sense amplifier selecting circuit having input logic that logically combines decoded upper address values and at least a first lower address value to generate a second select signal; and a third sense amplifier selecting circuit having input logic that logically combines decoded upper address values and at least a second lower address value to generate a third select signal.

17. The semiconductor memory device of claim 16, wherein:

each sense amplifier selecting circuit including a first drive transistor of a first conductivity type and a second drive transistor of a second conductivity type, the first and second drive transistors being activated in response to the select signal of its corresponding sense amplifier selecting circuit.

18. The semiconductor memory device of claim 16, further including:

a plurality of memory cell arrays, each memory cell array including a plurality of word lines; and a plurality of decoders disposed between sense amplifier selecting circuits, each decoder being coupled to an associated memory cell array and activating a word line within its associated memory cell array in response to the select signals of adjacent sense amplifier selecting circuits.

19. The semiconductor memory device of claim 16, further including:

a fourth sense amplifier selecting circuit that includes input logic that logically combines decoded upper address values and at least a third address value to generate a fourth select signal.

20. The semiconductor memory device of claim 16, further including:

a sense amplifier column corresponding to each sense amplifier selecting circuit, each sense amplifier including a plurality of sense amplifiers, at least one sense amplifier being selected in response to the select signal of the corresponding sense amplifier selecting circuit.

* * * * *